United States Patent [19]

Sato

[11] Patent Number: 4,801,168
[45] Date of Patent: Jan. 31, 1989

[54] DEVICE FOR TRANSFERRING SEMICONDUCTOR WAFERS

[75] Inventor: Ryosuke Sato, Kanagawa, Japan

[73] Assignee: Sony Corporation, Tokyo, Japan

[21] Appl. No.: 853,624

[22] Filed: Apr. 18, 1986

[30] Foreign Application Priority Data

Apr. 22, 1985 [JP] Japan .................................. 60-85953

[51] Int. Cl.4 ........................ B25J 13/04; B65G 65/00
[52] U.S. Cl. .................................. 294/87.1; 294/119.1; 294/902
[58] Field of Search .................. 294/86.4, 87.1, 103.1, 294/104, 106, 119.1, 902; 29/739–741; 414/225, 226, 403, 404, 736; 901/31, 39

[56] References Cited

U.S. PATENT DOCUMENTS

| 4,023,691 | 5/1977 | Perel | 294/87.1 X |
| 4,286,380 | 9/1981 | Blount | 294/87.1 X |
| 4,466,766 | 8/1984 | Geren | 294/87.1 X |
| 4,568,234 | 2/1986 | Lee et al. | 294/87.1 X |
| 4,573,851 | 3/1986 | Butler | 414/404 |
| 4,611,966 | 9/1986 | Johnson | 294/87.1 X |

FOREIGN PATENT DOCUMENTS 1096191 6/1984 U.S.S.R. ............................. 294/87.1

Primary Examiner—Johnny D. Cherry
Attorney, Agent, or Firm—Ronald P. Kananen

[57] ABSTRACT

An improved semiconductor wafer transferring device lifts and drops at least two groups of semiconductor wafers at different times in each lifting or dropping cycle, in order to reduce the impact sustained by a semiconductor wafer holder such as a wafer boat in the former case and preventing the semiconductor wafer holder from being lifted in the latter case.

8 Claims, 2 Drawing Sheets

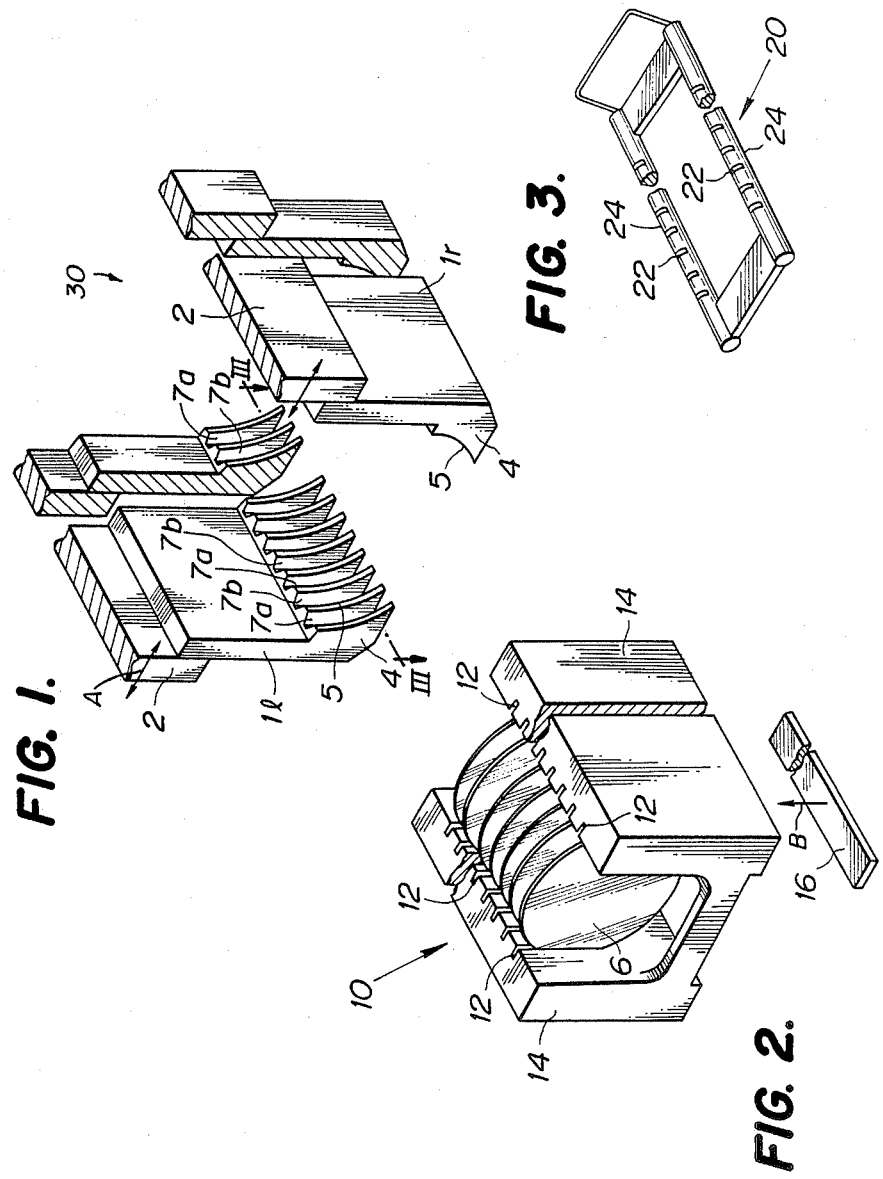

DEVICE FOR TRANSFERRING SEMICONDUCTOR WAFERS

BACKGROUND OF THE INVENTION

The present invention relates generally to a device for transferring semiconductor wafers. More specifically, the invention relates to a semiconductor wafer transferring device for transferring a plurality of semiconductor wafers between a wafer cassette and a wafer boat or the like, simultaneously.

As is well known, semiconductor wafers for use in IC manufacture, LSI and so forth are held in wafer cassettes before being treated by diffusion or CVD processes or the like. Wafer cassettes are generally designed to hold a large number of semiconductor wafers. For example, a typical wafer cassette can hold 25 semiconductor wafers. Such wafer cassettes generally comprise a pair of holder walls lying vertically and parallel to each other. The lower corners of the holder walls are connected to each other by means of connection strips so as to be held at a fixed spacing. A plurality of wafer retention grooves are formed on the opposing surfaces of the holder walls. Each wafer retention groove extends essentially vertically from the top of the associated holder wall to the vertical center of the holder wall. Semiconductor wafers are vertically held within the wafer cassette, wherein one wafer is disposed in each of the wafer retention grooves of the holder walls.

For diffusion, CVD treatment and so forth, the semiconductor wafers held in the wafer cassette must be transferred to a wafer boat which comprises a heat-resistant material, such as quartz, for placement in a diffusion furnace or the like. After treatment, the semiconductor wafers are removed from the furnace by way of the wafer boat. Thereafter, the treated semiconductor wafers are transferred from the wafer boat back to the wafer cassette.

The wafer boat generally comprises a pair of retention bars lying parallel to each other. The retention bars are connected to each other by means of connecting pieces. The retention bars have a plurality of opposing, regularly spaced wafer retention grooves which retain the semiconductor wafers by their edges.

In order to transfer a plurality of semiconductor wafers between the wafer cassette and the wafer boat, a typical conventional wafer transferring device comprises a pair of opposing retention plates with a plurality of curved grooves. The retention plates of the wafer transferring device can be moved toward and away from each other. At their closest position, the retention plates can grasp the semiconductor wafers therebetween, with the edges of the wafers fitting into the grooves. On the other hand, when the retention walls are shifted away from each other, they release the semiconductor wafers to either the wafer cassette or the wafer boat.

Practical transferral of wafers utilizing the conventional wafer transferring device involves pushing the semiconductor wafers held either by the wafer cassette or the wafer boat upwardly by means of a pusher so that the retention plates can grasp all of the semiconductor wafers simultaneously. Then, the wafer transferring device carries the wafers to the other of the wafer cassette and the wafer boat. Once positioned immediately above the other of the wafer cassette and the wafer boat, the retention walls are separated to release the wafers onto the boat or cassette.

In the case where the semiconductor wafers are to be transferred from the wafer cassette to the wafer boat, the impact due to dropping the wafers onto the wafer boat may be sufficiently hard to chip either the wafer boat and/or the edges of the wafers per se.

In addition, as is well known, so as to minimize the area of contact between the grooves of the retention bars of the wafer boat while retaining the semiconductor wafers in an essentially vertical position, the width of the grooves of the retention bars is selected to leave very little clearance with the surfaces of the semiconductor wafers. Thus, the semiconductor wafers tend to stick to the grooves. As a result, the upward force exerted on the semiconductor wafers held by the retention plates of the wafer transferring device to lift the wafers off the boat may lift the wafer boat as well.

SUMMARY OF THE INVENTION

Therefore, it is an principle object of the present invention to solve the foregoing problems in a conventional semiconductor wafer transferring device.

Another and more specific object of the present invention is to provide an improved wafer transferring device which can limit the impact or shock to which the semiconductor wafers are subjected during transferral between a wafer cassette and a wafer boat.

In order to accomplish the aforementioned and other objects, an improved semiconductor wafer transferring device, according to the present invention, includes a feature for lifting and dropping some of a plurality of semiconductor wafers at different times during single lifting and dropping operations.

In order to accomplish the above-mentioned and other objects, a semiconductor wafer transferring device comprises a pair of holder walls movable between a first position in which a plurality of semiconductor wafers are held therebetween, and a second position in which the semiconductor wafers are released from the holder walls, first means, associated with the holder walls, for retention of at least one or a first set of semiconductor wafers from among the plurality of semiconductor wafers, the first means being operable between a wafer retention position corresponding to the first position of the holder wall and a wafer releasing position corresponding to the second position of the holder walls, and second means, associated with the holder walls, for retention of at least another or second set of semiconductor wafers from among the plurality of semiconductor wafers, the second means being operable between a wafer retention position corresponding to the first position of the holder walls and a wafer releasing position corresponding to the second position of the holder walls, the second means being operated between the wafer retention position and the wafer releasing position in response to movement of the holder walls between the first and second positions, at a different time of operation than the first means.

The first means comprises first grooves formed in the holder walls and engageable with the peripheral edges of the first set of semiconductor wafers for retention of the latter in the first position of the holder walls and releasing the first set of semiconductor wafers at a first point during movement from the first position to the second position, and the second means comprises second grooves formed in the holder walls and engageable with the peripheral edges of the second set of semiconductor wafers for retention of the latter at the first position of the holder walls and releasing the second set of semiconductor wafers at a second point during movement from the first position to the second position. The first means comprises a plurality of first grooves formed on each of the holder walls and the second means comprises a plurality of second grooves formed on each of the holder walls.

The first grooves of the first means on at least one of the holder walls are shallower than the second grooves of the second means on the corresponding holder walls.

The holder walls are supported by a transferring machine which carries it between one station where the semiconductor wafers are held vertical, and another station which receives and holds the transferred semiconductor wafers vertical.

The transferring machine drives the holder walls between the first and second positions.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment illustrated but are for explanation and understanding only.

In the drawings:

FIG. 1 is a cut-away perspective view of the preferred embodiment of a semiconductor wafer transferring device according to the present invention;

FIG. 2 is a perspective view of a wafer cassette with semiconductor wafers loaded therein;

FIG. 3 is a perspective view of a wafer boat for transferring semiconductor wafers to the wafer cassette of FIG. 2 by the device of FIG. 1;

DESCRIPTION OF THE PREFERRED EMBODIMENTS

Figure 4:
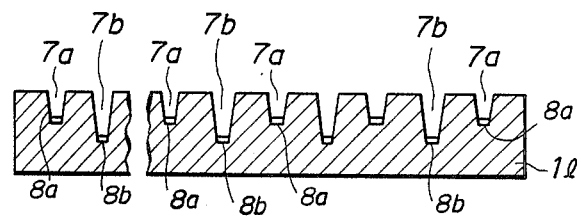
FIG. 4 is a section taken along line III—III of FIG. 1.

Referring now to the drawings, particularly to FIGS. 1 and 2, the preferred embodiment of a semiconductor wafers transferring device 30 according to the present invention generally comprises a pair of holder walls $1_r$ and $1_l$ having mutually opposing faces. The holder walls $1_r$ and $1_l$ are vertically suspended from a wafer transferring machine (not shown) by means of supporting strips 2. The holder walls $1_r$ and $1_l$ are identical but arranged in mirror symmetry with respect to each other.

The holder walls $1_r$ and $1_l$ have lower sections 4 of greater thickness than the upper section at which they are attached to the supporting strips 2. The lower sections 4 respectively include mutually opposing, inwardly curving surfaces 5 merging toward each other at the lowermost portion of the device 30. The surfaces 5 of the lower sections 4 have a slightly smaller radius of curvature than the disc-shaped semiconductor wafers 6. A plurality of parallel retention grooves 7a and 7b are formed along each of the surfaces 5. These retention grooves are designed to receive and hold the peripheral edges of the semiconductor wafers 6. The floors 8a and 8b of the retention grooves 7a and 7b have essentially the same curvature as the semiconductor wafers. The floors 8a and 8b of the retention grooves 7a and 7b are staggered across the surfaces 5 at different depths, as shown in FIG. 4. For instance, in the shown embodiment, 25 grooves are formed on each surface 5 and the odd-numbered grooves 7a are all shallower than the even-numbered grooves 7b. With this construction, the semiconductor wafers in the odd-numbered grooves 7a ride higher than those in the even-numbered grooves 7b.

The supporting strips 2 are movable toward and away from each other in the direction of the arrows A so as to shift the holder walls $1_r$ and $1_l$ between a wafer retention position, in which the distance between the holder walls $1_l$ and $1_r$ is minimized, and a release position, in which the distance between the holder walls $1_l$ and $1_r$ is expanded, so that the semiconductor wafers held between the holder walls $1_l$ and $1_r$ while the holder walls are in the wafer retention position can be released.

This semiconductor wafer transferring device 30 is used to transfer a plurality of semiconductor wafers between a wafer cassette 10 and a wafer boat 20, shown in FIG. 3, construction of which is known per se and not essential to the present invention. Therefore, the structures of the wafer cassette 10 and the wafer boat 20 will be described below only with regard to the operation of the preferred embodiment of the semiconductor wafer transferring device according to the present invention, with reference to FIGS. 1–3.

As set forth, the semiconductor wafers 6 are held in the wafer cassette 10 before diffusion treatment, CVD treatment and so forth. In this case, the peripheral edges of the semiconductor wafers 6 engage the retention grooves 12 in the opposing faces of vertical holder walls 14 of the wafer cassette 10. When the semiconductor wafers 6 are to be removed from the wafer cassette 10, a pusher plate 16 moves upwards in the direction of the arrow B to push the semiconductor wafers upward. During this upward movement of the semiconductor wafers 6 along the retention grooves 12, the support strips 2 of the semiconductor wafers transferring device hold the holder walls $1_r$ and $1_l$ at their spaced or release positions.

The semiconductor wafers 6 are pushed upwards until most of their surface projects above the upper face of the wafer cassette 10. Thereafter, during further movement of the pusher plate 16, the supporting strips 2 move to the wafer retention position to grip the semiconductor wafers while keeping the holder walls $1_r$ and $1_l$ in alignment with the retention grooves 12 and the edge of the corresponding semiconductor wafers 6.

The holder walls $1_r$ and $1_l$, now gripping the semiconductor wafers 6 in the wafer retention position, shift to a position above the wafer boat 20. At this position, the supporting strips 2 gradually separate by movement apart in the direction of the arrows A. The gradual expansion of the distance between the holder walls $1_r$ and $1_l$ gently releases the semiconductor wafers 6 from the wafer transferring device 30 to the wafer boat 20.

At this time, first, the semiconductor wafers 6 in the retention grooves 7a are first released from the holder walls $1_r$ and $1_l$ and drop onto the wafer boat 20. Thereafter, the semiconductor wafers in the deeper grooves 7b are released from the holder walls. The semiconductor wafers 6 dropped onto the wafer boat 20 respectively slip into associated retention grooves 22 in the holder bars 24 of the wafer boat 20.

As will be appreciated herefrom, the semiconductor wafers to be transferred are separated into two groups or sets which drop onto the wafer boat at two different times. This reduces the impact sustained when the semiconductor wafers are dropped onto the wafer boat by approximately one-half of that due to conventional devices. This significantly reduces the possibility of chipping of the wafer boat 20 and/or the edges of the semiconductor wafers 6.

On the other hand, when the semiconductor wafers 6 held in the wafer boat 20 are to be transferred to the wafer cassette 10, first the holder walls $1_r$ and $1_l$ are moved to the spaced or release position in the direction of the arrows A. Once the retention grooves 7a and 7b are in alignment with the semiconductor wafers 6, the holder walls $1_r$ and $1_l$ are shifted toward each other to the retention position. During this movement, first, the edges of the semiconductor wafers 6 come into contact with the floors of the shallower grooves 7a and thus are released from the wafer boat 20. Shortly thereafter, the edges of the semiconductor wafers 6 corresponding to the deeper retention grooves 7b come into contact with the floors of those deeper retention grooves. Thus, after a slight time lag, the semiconductor wafers to be held by the retention grooves 7b are released from the retention grooves 22.

This makes it easier to pick up the semiconductor wafers 6 from the cassette boat 20 and reduces the possibility of lifting the wafer boat 20 along with the wafers 6.

Figure 5:
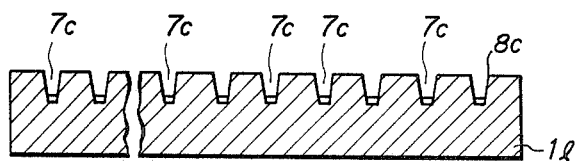
FIG. 5 is a section similar to FIG. 4, but showing a modification to the transferring device of FIGS. 1 to 4.

Although a specific structure of the preferred embodiment of the semiconductor wafer transferring device has been disclosed above, the present invention is not necessarily limited to the shown embodiment. For example, in order to diversify the pick-up timing and drop timing, it is necessary to have retention grooves 7a and 7b of different depths on both of the holder walls $1_r$ and $1_l$. In an alternative embodiment, the retention grooves 7c of one of the holder walls $1_r$ and $1_l$ can all have the same depth 8c as shown in FIG. 5. In this case, the other holder wall $1_r$ or $1_l$ will have two sets of retention grooves 7a and 7b of different depths as set out above. With this arrangement, the semiconductor wafer pick-up timing and drop timing can be staggered in substantially the same manner as in the preferred embodiment.

If necessary, the pick-up timing and drop timing of a plurality of semiconductor wafers can be staggered into three groups or more. If it is desired to pick-up and drop semiconductor wafers at three different timings, at least one of the holder walls should be provided with three groups of retention grooves of three different depths.

While the present invention has been disclosed in terms of the preferred embodiment in order to facilitate a better understanding of the invention, it should be appreciated that the invention can be embodied in various ways without departing from the principle of the invention. Therefore, the invention should be understood to include all possible embodiments and modifications to the shown embodiments which can be embodied without departing from the principles of the invention set out in the appended claims.

What is claimed is:

1. A semiconductor wafer transferring device comprising:
    a pair of holder walls movable between a first position in which a plurality of semiconductor wafers are held therebetween, and a second position in which said plurality of semiconductor wafers are released from said holder walls;
    first means, associated with said holder walls, for retention of a first set of semiconductor wafers from among said plurality of semiconductor wafers while said pair of holder walls are in said first position, said first means releasing said first set of semiconductor wafers at a third position of said holder walls moving from said first position to said second position; and
    second means, associated with said holder walls, for retention of a second set of semiconductor wafers from along said plurality of semiconductor wafers while said pair of holder walls are in said first position, said second means releasing said second set of semiconductor wafers at a fourth position of said holder walls moving from said first position to said second position, said fourth position being different from said third position.

2. A semiconductor wafer transferring device as set forth in claim 1, wherein said first means comprises first grooves formed in said holder walls and engageable with the peripheral edges of said first set of semiconductor wafers for retention of the latter in said first position of said holder walls and releasing said first set of semiconductor wafers at said third position during movement from said first position to said second position, and said second means comprises second grooves formed in said holder walls and engageable with the peripheral edges of said second set of semiconductor wafers for retention of the latter at said first position of said holder walls and releasing said second set of semiconductor wafers at said fourth position during movement from said first position to said second position.

3. A semiconductor wafer transferring device as set forth in claim 2, wherein said first means comprises a plurality of first grooves formed on each of said holder walls and said second means comprises a plurality of second grooves formed on each of said holder walls.

4. A semiconductor wafer transferring device as set forth in claim 3, wherein said first grooves on at least one of said pair of holder walls are shallower than said second grooves on the holder walls.

5. A semiconductor wafer transferring device as set forth in claim 4, wherein said holder walls further include means for support by a transferring machine which carries said device between one station where said semiconductor wafers are held vertical, and another station which receives and holds the transferred semiconductor wafers vertical.

6. A semiconductor wafer transferring device comprising:
    a pair of holder walls movable between a first position in which at least a first and second semiconductor wafer are held therebetween, and a second position in which said semiconductor wafers are released from said holder walls;
    first means, associated with said holder walls, for retention of said first semiconductor wafer while said pair of holder walls are in said first position, said first means releasing said first semiconductor wafer at a third position of said holder walls moving from said first position to said second position; and
    second means, associated with said holder walls, for retention of said second semiconductor wafer while said pair of holder wall are in said first position, said second means releasing said second semiconductor wafer at a fourth position of said holder walls moving from said first position to said second position, said fourth position being different from said third position.

7. A semiconductor wafer transferring device as set forth in claim 6, wherein said third position and said fourth position of said pair of holder walls each lie intermediate said first position and said second position of said holder walls.

8. A semiconductor wafer transferring device for transferring semiconductor wafers between a first device such as a wafer cassette and a second device such as a wafer boat, comprising:

a pair of opposed holder walls, each having a plurality of parallel retention grooves formed along said walls, each having curved surfaces inwardly curving toward each other to define therebetween a groove for retaining a semiconductor wafer in opposing grooves located between opposing pairs of said curving surfaces, said retention grooves being further defined by floors having a curvature about equal to a curvature of said semiconductor wafers, the depth of the floors of said retention grooves being staggered along at least one of said opposing walls, so that wafers in a groove of a first depth are released at a time different from the release of wafers in a groove of a second depth as said opposing walls are moved from a first wafer retention position to a second wafer release position; and said holder walls are movable relative to each other from a first, most-close position which retains said semiconductor wafers in said grooves, a second most-open position which releases said semiconductor wafers, and a third intermediate position which releases at least the semiconductor wafers positioned in grooves having a common depth.

* * * * *